United States Patent [19]

Langeac

[11] Patent Number: 4,563,639
[45] Date of Patent: Jan. 7, 1986

[54] TEMPERATURE AND/OR ELECTRICAL INTENSITY MEASURING APPARATUS BASED ON THE FARADAY EFFECT

[75] Inventor: Daniel Langeac, Grenoble, France
[73] Assignee: Commissariat a l'Energie Atomique, Paris, France
[21] Appl. No.: 542,971
[22] Filed: Oct. 18, 1983

[30] Foreign Application Priority Data

Oct. 28, 1982 [FR] France ................... 82 18102

[51] Int. Cl.$^4$ ................ G01R 15/07; G01K 1/00; G01K 13/00
[52] U.S. Cl. ...................... 324/96; 250/227; 350/96.29; 350/374; 356/368; 374/131; 374/142
[58] Field of Search ............. 324/96; 374/161, 131, 374/142; 350/96.29, 374; 250/227; 356/44, 368

[56] References Cited

U.S. PATENT DOCUMENTS

| 4,151,747 | 5/1979 | Gottleib et al. | 374/161 |
| 4,255,018 | 3/1981 | Ulrich et al. | 324/96 |

FOREIGN PATENT DOCUMENTS

| 2924804 | 1/1981 | Fed. Rep. of Germany | 350/96.29 |
| 3115433 | 11/1982 | Fed. Rep. of Germany | 324/96 |
| 57-79416 | 5/1982 | Japan | 374/161 |
| 2100018 | 12/1982 | United Kingdom | 324/96 |
| 2104213 | 3/1983 | United Kingdom | 324/96 |

OTHER PUBLICATIONS

Rashleigh, S. and Ulrich, R., "Magneto-Optic Current Sensing with Birefringent Fibers", Applied Physics Letters, 34 (11), Jun. 1, 1979, pp. 768–770.

*Primary Examiner*—Stewart J. Levy
*Assistant Examiner*—Stephen M. Baker
*Attorney, Agent, or Firm*—Pearne, Gordon, Sessions, McCoy, Granger & Tilberry

[57] ABSTRACT

Apparatus for measuring the temperature and/or electrical intensity based on the Faraday effect. It comprises a probe constituted by an optical fibre, wound in a generally solenoid form and two optical fibre strands connecting the probe to an inlet coupled to a polarized light source and to an outlet coupled to means for measuring the rotation angle of the light polarization plane, the optical fibre portion constituting the probe being twisted about its longitudinal axis in a random single direction. The two optical fibre strands connecting the probe respectively to the inlet and outlet of the system are twisted in opposite directions, the number of twisting turns to the right of one of the strands being equal to the number of twisting turns to the left of the other.

1 Claim, 5 Drawing Figures

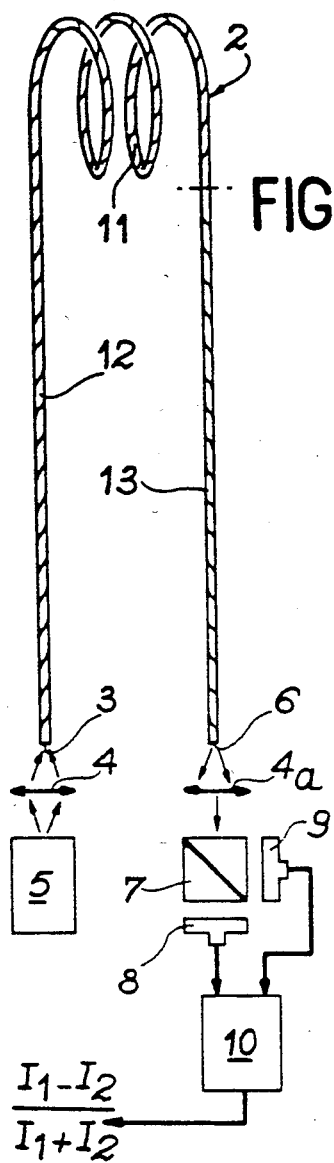
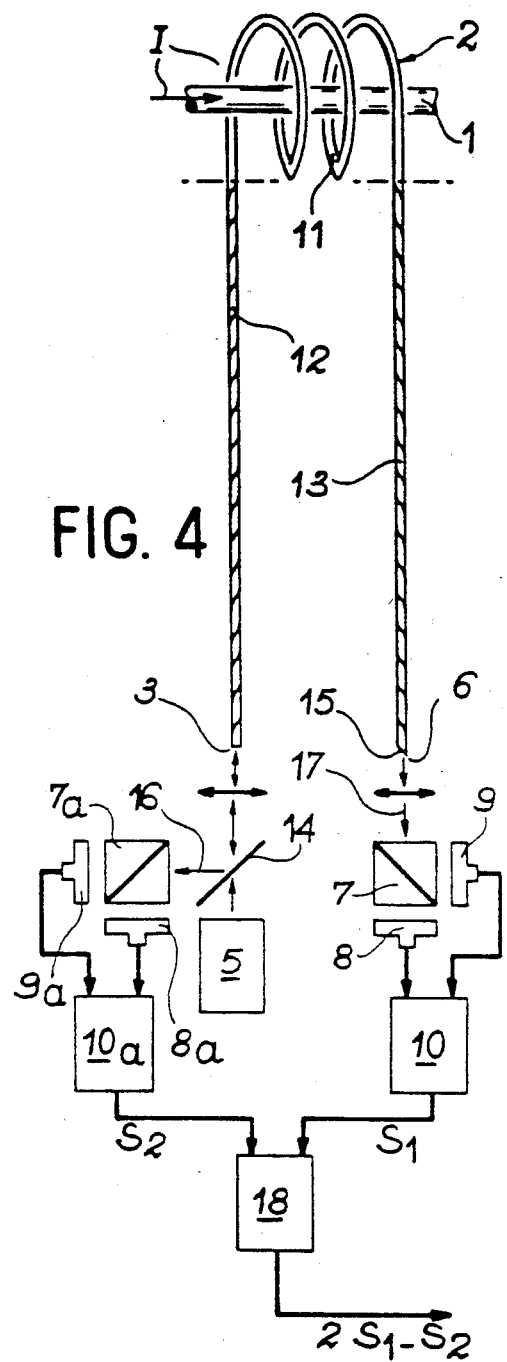
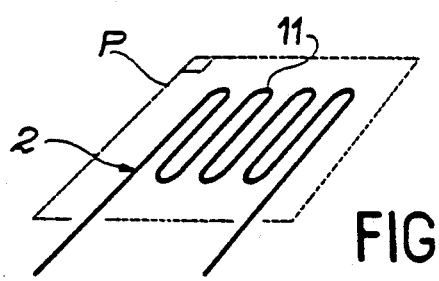

TEMPERATURE AND/OR ELECTRICAL INTENSITY MEASURING APPARATUS BASED ON THE FARADAY EFFECT

BACKGROUND OF THE INVENTION

The present invention relates to the measurement of temperatures and/or electrical currents by the Faraday effect and which is more particularly used in the case where said measurement takes place in a difficult environment and particularly on electrical conductors at a high voltage compared with earth or in environments subject to large temperature variations.

The apparatus according to the invention utilizes known magneto-optical current measuring methods.

The magneto-optical effect used is the Faraday effect, according to which the polarization plane of a linearly polarized light beam rotates by an angle $\omega$ under the effect of an electrical field H, produced by the current to be measured and proportional to the intensity I of the latter. The rotation angle $\omega$ of the polarization plane of the light subject to the magnetic field H is, as a first approximation, proportional to said field and consequently to the intensity I which has given rise thereto. Thus, by using this known Faraday effect, it is obviously possible to realise an electrical intensity measuring apparatus.

Thus, more specifically, the rotation angle $\omega$ of the polarization plane of the light is given by the formula:

$$\omega = V_e \int \vec{H} \cdot \vec{dl}$$

in which $\vec{H}$ is the magnetic field created by the current I to be measured and to which is exposed a polarized light source; l is the interaction length between the field and the path of the polarized light beam; $V_e$ is a specific constant of the medium, called Verdet's constant. This constant is high for ferromagnetic materials and low for diamagnetic materials, such as optical fibres. It should also be noted that for diamagnetic materials, it is independent of the temperature.

According to Ampere's theorem, it is possible to write:

$$\int \vec{H} \cdot \vec{dl} = N \cdot I$$

on a closed curve, N being the number of rotations of the light about the conductor traversed by the intensity I, this means $\omega = V_e \cdot N \cdot I$, which establishes the proportionality of current I and angle $\omega$.

Ampere meters for measuring the electrical intensity based on the Faraday effect have more particularly been described in the following articles:

(1) "Mesure d'un courant par un ampèremètre à effet Faraday" by P. Heroin, C. Benoist and Y. De La Marre, published in the Revue Gènèrale de l'Electricitè, July/August 1967, p. 1045;

(2) "Optical Fibers for Current Measurement Applications" by A. M. SMITH, published in the journal Optics and Laser Technology, February 1980, p. 25.

For measuring the current in a conductor, it is proposed therein to wind a monomode optical fibre about the conductor, so as to increase the interaction length between the magnetic field and the light wave propagating in the optical fibre. It is consequently possible to compensate the low value of Verdet's constant in a diamagnetic material by a significant magneto-optical interaction length and to benefit from the invariability of this constant with the temperature in such a material.

A per se known Faraday effect electrical intensity measuring apparatus is shown in the attached FIG. 1. It comprises a monomode optical fibre 2 wound with one or more turns around conductor 1 in the manner of a solenoid and said conductor is traversed by an electrical current I, which it is wished to measure. The inlet end 3 of the optical fibre 2 is coupled by a lens 4 to a linearly polarized light source, which is advantageously a laser diode 5. The outlet end 6 of the optical fibre 2 is followed by a lens 4a and a device for analyzing the rotation of the polarization plane of the light which has traversed the optical fibre 2 after entering the same at 3.

For example, this device can be a Wollaston prism 7 giving two light beams of respective intensities $I_1$ and $I_2$, which are linearly and orthogonally polarized and which are received by light detection means 8, 9 connected to an analog electronic circuit 10 calculating the expression $P = (I_1 - I_2)/(I_1 + I_2)$. It is known that this expression P is equal to sin $2\omega$, which is close to $2\omega$ when $\omega$ is low, which is generally the case for the magnetic fields produced by the currents which it is wished to measure (e.g. the current circulating in electricity networks). The electronic circuit thus supplies a signal which is proportional to the intensity I to be measured. The device for analyzing the light polarization at outlet 6 of fibre 2 can also be a beam splitter associated with two crossed polarizers or, as is the case in FIG. 2, a polarizing beam splitter 7, associated with two photodiodes 8, 9, each detecting intensities $I_1$ and $I_2$ of two linearly and orthogonally polarized light beams. An analog electronic unit 10 then calculates the ratio $$P = (I_1 - I_2)/(I_1 + I_2)$$

to which reference was made hereinbefore and which represents the intensity I to be measured in conductor 1.

Unfortunately, the known apparatus of FIG. 2 does not make it possible to obtain precise and coherent measurements unless the precaution is taken of overcoming the parasitic linear birefringence phenomena caused in numerous different ways, such as the manufacturing process, the curvature of the fibre and temperature variations, in a conventional monomode optical fibre. Such phenomena have the serious disadvantage of destroying the linearity of the polarization of the light wave during its passage through the optical fibre.

To combat this difficulty, it has already been proposed to twist the optical fibre about its longitudinal axis in order to macroscopically cancel out the aforementioned birefringence phenomena. Such a known apparatus is shown in FIG. 2, where it is possible to see all the elements of FIG. 1 with the exception that, as is diagrammatically shown by the profile of a generatrix of the surface of the optical fibre alternately in continuous line and dotted line form, the latter has been longitudinally twisted before being wound in the form of a solenoid around the conductor 1 in which passes the intensity I to be measured.

Thus, although the apparatus of FIG. 2 makes it possible to retain its linear character on polarizing the light wave traversing fibre 2, the twisting of said optical fibre leads to a systematic optical activity and in the present case a natural rotation of the light polarization plane, which varies as a function of the temperature. Thus, on using an apparatus with the compensation of FIG. 2 in a medium where the temperature evolves, without taking special precautions for eliminating the influence of this temperature, it is not possible to distinguish in the resultant rotation of the polarization plane, the component due to the temperature variations and the component due to the actual Faraday effect.

SUMMARY OF THE INVENTION

The object of the present invention is a temperature and/or electrical intensity measuring apparatus based on the Faraday effect and which utilizes simple means permitting, in means derived from those of the aforementioned FIG. 2, the separation of the rotation component of the polarization plane due to the Faraday effect from that resulting from temperature variations.

The present invention therefore specifically relates to an apparatus for measuring the temperature and/or electrical intensity based on the Faraday effect using magneto-optical means and which comprises in per se known manner a probe constituted by an optical fibre wound in the general form of a solenoid and two optical fibre strands connecting the probe to an inlet coupled to a polarized light source and an outlet coupled to first means for measuring the rotation angle of the polarization plane of the light between its entrance and exit with respect to the system, the optical fibre portion constituting the probe being twisted about its longitudinal axis in a single random direction, wherein the two optical fibre strands connecting the said probe with the inlet and to the outlet of the system are twisted in opposite directions, the number of twisting turns to the right of one of the strands being equal to the number of twisting turns to the left of the other.

On the basis of what has been stated hereinbefore, it is easy to see that the probe twisted in a single random direction and located in a variable temperature medium, permits a direct measurement of said temperature. Thus, the two optical fibre strands connecting the probe to the inlet and outlet of the system are twisted in opposite directions so as to have a resultant zero twisting effect, which means that the possible temperature variations of the ambient medium induce in said two portions of the fibre, components which are completely compensated.

The invention also relates to an apparatus for measuring the temperature and/or electrical intensity based on the Faraday effect of the type in which the electrical intensity to be measured passes through a conductor wire positioned approximately along the axis of the probe, wherein it is also comprises, at the outlet from the system, a semi-transparent plate on the outlet face of the fibre and able to reflect along the return path at least part of the light beam towards the system inlet, as well as at the inlet of the system a semi-transparent plate, inclined by 45° to be incident light beam, and able to direct part of the reverse return light beam towards second means for measuring the rotation angle of the polarization plane of the light from its entrance into the system.

The improved measuring apparatus described hereinbefore thus involves the detection of the rotation of the polarization plane of the light which has traversed the system in two different ways. The first measuring means located at the outlet of the system determine the rotation of this rotation plane on that portion of the light which has traversed the system once. However, the second means for measuring the rotation angle of the polarization plane measure, at the entrance to the system, the rotation of that portion of the light beam which, after reflection on a semi-transparent plate located at the fibre outlet, has performed an outward and return path therein. Thus, at the system outlet is detected a rotation of the light polarization plane, whose quantity is expressed by the formula:

$$S_1 = V_e NI + \alpha(T)$$

in which $V_e$ is Verdet's constant, N the number of turns of the solenoid constituting the probe, I the intensity to be measured and $\alpha(T)$ a function of the temperature at the point where the probe is located, i.e. in the immediate vicinity of the conductor traversed by the intensity to be measured. Thus, as the two strands for coupling the optical fibre to the probe at the inlet and outlet are twisted in opposite directions and with a resultant zero twisting effect, the temperature variations possibly encountered by these two strands are perfectly compensated and only that portion of the optical fibre corresponding to the solenoid forming the probe is receptive to the temperature variations, i.e. to the function $\alpha(T)$.

At the entrance to the system is collected a signal $S_2 = 2V_e NI$, corresponding to double the Faraday signal for a single path, but on this occasion without any component corresponding to the temperature, because the two paths are each performed in a different direction and the two components due to the temperature at the location of the probe cancel one another out.

Thus, the improved measuring apparatus described makes it possible to obtain the value of the current by the signal collected on the inlet probe $S_2$ and it is merely necessary to form in a computer, the expression $2S_1 - S_2 = 2\alpha(T)$ in order to obtain the temperature. Thus, an apparatus is obtained, which is able to simultaneously measure at the same point, the intensity passing through a conductor and the temperature in the immediate vicinity of said conductor.

BRIEF DESCRIPTION OF THE DRAWINGS

The invention is decribed in greater detail hereinafter with respect to non-limitative embodiments and the attached FIGS. 1 through 4, wherein:

FIG. 3 shows an embodiment of the measuring apparatus according to the invention, functioning as a temperature measuring probe.

FIG. 3a shows a variant of the probe of FIG. 3.

FIG. 4 shows a measuring apparatus according to the invention permitting both the measurement of an electrical intensity and the temperature in the immediate vicinity of the conductor traversed by said intensity.

DETAILED DESCRIPTION OF THE INVENTION

Figure 1:
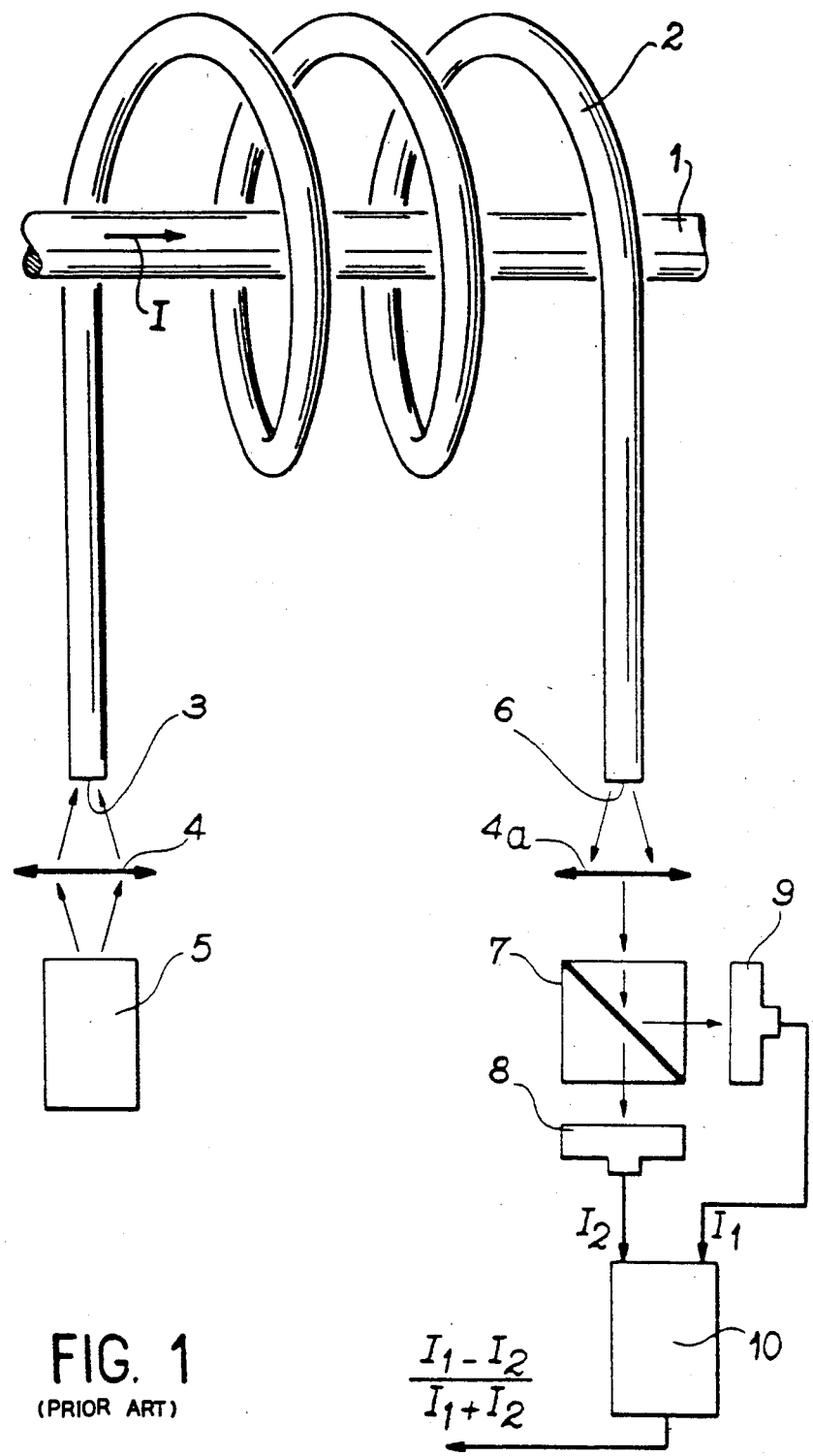
FIGS. 1 and 2 show prior art apparatus for measuring electrical intensity based on the Faraday effect.
Figure 2:
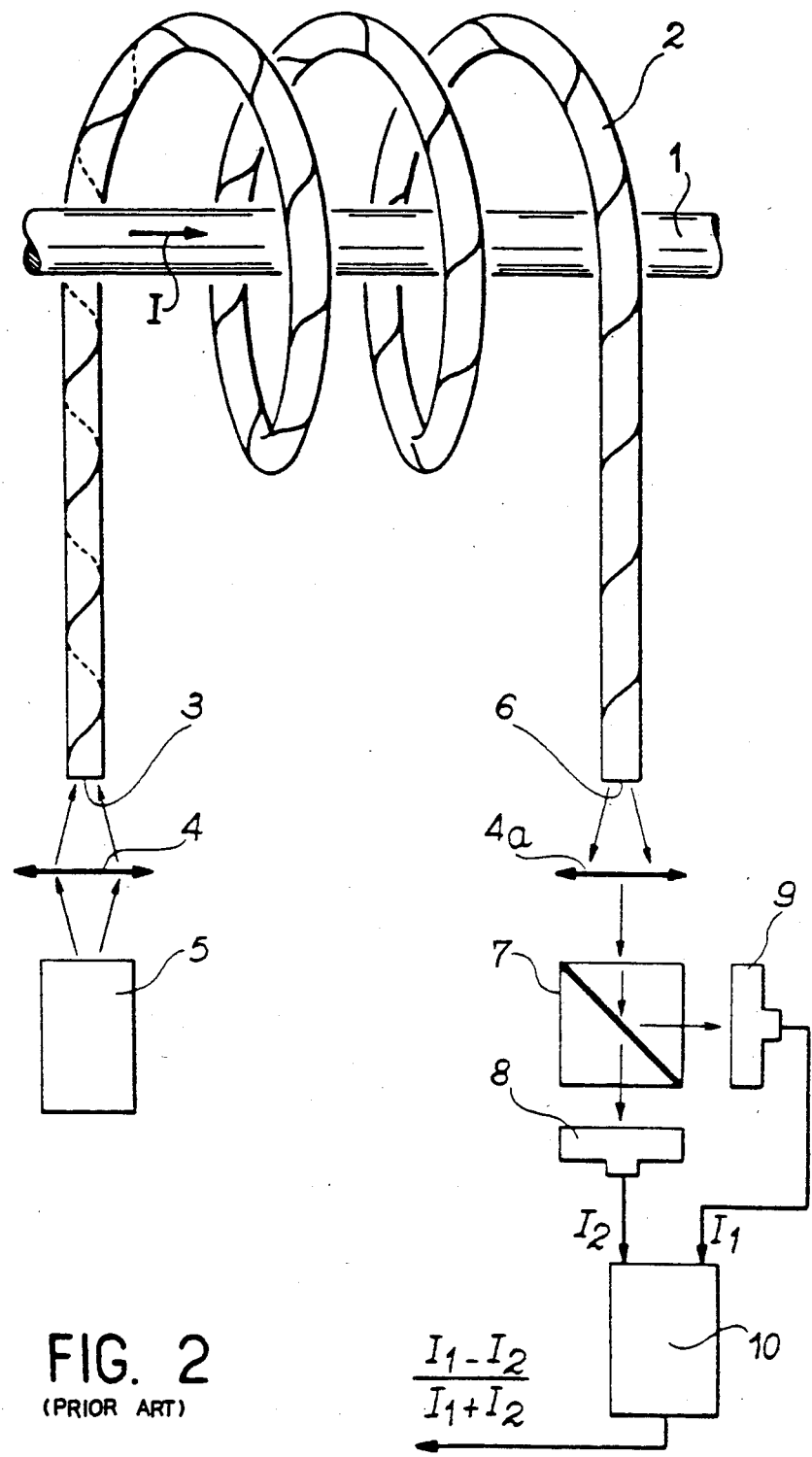

FIG. 3 shows a system which, like FIG. 2, comprises an optical fibre 2 having an inlet 3 and an outlet 6, a probe 11 in the form of a solenoid having a certain number of turns or a device having in a plane P an optical fibre in the form of a hairpin or comb, of FIG. 3a. Probe 11 is connected by two optical fibre strands 12, 13, respectively to the inlet 3 and the outlet 6 of the system. With regards to the linear polarized light supply and the measurement of the rotation of the polarization plane of the light at outlet 6, the means used are of a conventional nature and can be identical to those shown in FIG. 2 and this is represented in FIG. 3, where the same reference numerals are used.

However, according to the invention, the two optical fibre joining strands 12, 13 are twisted in opposite directions, i.e. the number of twisting turns to the right of strand 12 is equal to the number of twisting turns to the left of strand 13. Thus, it is possible to obtain an exact compensation of the effect induced by the temperature variations in the space surrounding the optical fibre strands 12, 13 and the rotation of the polarization plane obtained at the output of computer 10 is solely a function of the temperature prevailing in the vicinity of probe 11. Obviously, according to the invention, the optical fibre portion constituting the probe 11 is also twisted about its longitudinal axis, but in the same direction (which can be to the right or left), all along probe 11.

For example, the two strands 12 and 13 can be constituted by a monomode optical fibre marketed by ITT under the reference T-1602, whose dynamic break corresponds to twisting or torsions of 400 turns per meter. In the present embodiment, each of the strands has been twisted by 80 turns per meter, which leads to a rotation $\omega$ of the light polarization plane equal to 20° for a temperature variation of 20° to 120° C. Thus, a reliable and accurate measuring apparatus is obtained. The solenoid-like probe 11 has a diameter of 5 cm and comprises 7 windings of an optical fibre with a diameter of 0.5 mm. It is also twisted along its axis at a rate of 80 turns per meter. In the present embodiment, as the two strands 12, 13 have the same length of 1 meter, their degree of twisting is obviously the same. However, if for certain special applications, the two strands 12 and 13 did not have strictly the same length, it would then be sufficient to respect the resultant zero condition of the number of twisting turns in both directions being equal for each of the strands.

However, it should be noted that among the advantages of the apparatus according to FIG. 3, due to Ampere's theorem, the proximity of an electrical conductor has no influence on the temperature measurement, provided that it is not positioned within the loop of solenoid 11.

FIG. 4 once again shows the same elements as in FIG. 3 and the same references are used. However, a conductor 1 traversed by a current I to be measured is located in the axis of the solenoid constituting the probe 11. Moreover, and according to the invention, two semi-transparent plates 14, 15 are positioned respectively at the inlet 3 and the outlet 6 of the system. Plate 14 slopes by 45° and permits the exit of the light beam 16 used in the second means for measuring the rotation angle of the light polarization plane and which can be of a per se known type. A second semi-transparent plate 15 is positioned at end 6 of the optical fibre strand 13 in order to ensure the return of part of the light flux on the reverse path to the inlet 3 of fibre 12.

At inlet 3 in FIG. 4, there are second means for reading the rotation of the polarization angle and which are identical to those of FIGS. 2 and 3. The aforementioned quantity $S_2$ is obtained at the output of computer 10a. Identical means are also provided at the outlet 6 of the system, where the computer 10 processes quantity $S_1$.

According to the invention, the signals $S_1$ and $S_2$ respectively present on light paths 17 and 16 on leaving computers 10a and 10 are passed to an analog computer 18 which forms the expression $2S - S_2$, which represents the temperature in the probe 11. For the reasons given hereinbefore, quantity $S_2$ alone represents the current I circulating in conductor 1 within probe 11.

Obviously, in the apparatus according to FIG. 4, the optical fibre portion constituting the solenoid 11 of the probe is twisted about its longitudinal axis in the same direction, which can either be to the right or the left. The two strands 12, 13 for connecting probe 11 to inlet end 3 and outlet end 6 of the system are twisted in reverse directions, i.e. there is a resultant zero number of twisting turns.

What is claimed is:

1. An apparatus for measuring the temperature in the vicinity of an electrical conductor, and/or the amount of electrical current through such conductor, said measuring being based on the Faraday effect using magneto-optical means, said apparatus comprising a probe constituted by an optical fibre wound in the general form of a solenoid, said conductor lying along the longitudinal axis of the solenoid, and two optical fibre strands connecting respective ends of the probe to an inlet coupled to a polarized light source and an outlet coupled to first computer means for measuring the rotation angle of the polarizaton plane of the light between its entrance into the inlet optical fibre strand and its exit from the outlet optical fibre strand, the optical fibre portion constituting the probe being twisted about its longitudinal axis in a single random direction, the said two optical fibre strands connected to the probe being twisted in opposite directions relative to each other, the number of twisting turns to the right of one of the said two strands being equal to the number of twisting turns to the left of the other of said two strands, said apparatus further comprising, at the outlet end of said outlet optical fibre strand, a semi-transparent plate on the outlet face of the said outlet fibre strand able to reflect along a return path back into the outlet strand at least part of the light beam towrds the inlet face of the inlet strand, said apparatus further including at said inlet face another semi-transparent plate, inclined by 45° to the incident light beam, and able to direct part of the return path light beam towards second computer means for measuring the rotation angle of the polarization plane of the light from its entrance into the system, and third computer means connected to said first and second computer means for generating at its output an expression indicative of the current flow through said conductor and/or the temperature in the vicinity thereof.

* * * * *